United States Patent [19]

Higashiyama et al.

[11] Patent Number: 5,545,610
[45] Date of Patent: Aug. 13, 1996

[54] OXIDE-BASED SUPERCONDUCTOR, A PROCESS FOR PREPARING THE SAME AND A WIRE MATERIAL OF COMPRISING THE SAME

[75] Inventors: Kazutoshi Higashiyama; Toshiya Doi; Takesi Ozawa, all of Hitachi; Seizi Takeuchi, Hitachiota; Tomoichi Kamo, Ibaraki-ken; Shinpei Matsuda, Tokyo; Yutaka Yoshida, Hitachi, all of Japan

[73] Assignee: Hitachi, Ltd., Tokyo, Japan

[21] Appl. No.: 115,056

[22] Filed: Sep. 2, 1993

[30] Foreign Application Priority Data

Sep. 4, 1992 [JP] Japan .................................. 4-260491

[51] Int. Cl.$^6$ .......................... B32B 9/00; H01B 12/00; H01L 39/12
[52] U.S. Cl. .......................... 505/120; 505/783; 505/704; 505/740; 505/733; 505/237; 505/238; 505/492; 505/501; 252/521; 252/518; 428/930; 501/123
[58] Field of Search ................. 505/1, 783, 704, 505/740, 733, 120, 237, 238, 492, 501; 252/521, 518; 428/930; 501/123

[56] References Cited

U.S. PATENT DOCUMENTS

| | | | |
|---|---|---|---|
| 5,049,541 | 9/1991 | Uzumaki et al. | 505/501 |
| 5,252,543 | 10/1993 | Tanaka et al. | 505/704 |

FOREIGN PATENT DOCUMENTS

| | | |
|---|---|---|
| 431170 | 6/1991 | European Pat. Off. . |
| 2-69320 | 3/1990 | Japan .................................. 505/783 |
| 90/01461 | 2/1990 | WIPO . |

OTHER PUBLICATIONS

Applied Physics Letters, vol. 59, No. 24, 9, Dec. 1991, New York, US–pp. 3186–3188 Tomoichi Kamo, et al "Introduction of pinning centers into TR1–(1223) phase of Tl–Sr–Ca–Cu–O systems".

Patent Abstracts of Japan, vol. 014, No. 034 (C–679) 23 Jan. 1990 & JP–A–01 270 561 (Nippon Steel Corp.) 27 Oct. 1989.

Patent Abstracts of Japan, vol. 014, No. 131 (C–0700) 13 Mar. 1990 & JP–A–02 006 330 (Sanyo Electric Co Ltd) 10 Jan. 1990.

Patent Abstracts of Japan, vol. 015, No. 177 (C–0829) 7 May 1991 & JP= A–03 040 954 (Sony Corp) 21 Feb. 1991.

*Primary Examiner*—Melissa Bonner
*Attorney, Agent, or Firm*—Antonelli, Terry, Stout & Kraus

[57] ABSTRACT

An oxide-based superconductor comprising Tl, Pb, Sr, Ca and Cu or Tl, Pb, Ba, Sr, Ca and Cu, prepared by subjecting a low melting point composition comprising the superconductor-constituting elements and a solid composition comprising the superconductor-constituting elements, prepared in advance, to reaction under melting conditions for the low melting point composition, has distinguished current pass characteristics in a high magnetic field due to improvement of electric contact among grains through reduction of non-superconductor phase, increase in crystal grain sizes (reduction of crystal boundaries), orientation of crystal and cleaning of crystal boundaries.

5 Claims, 3 Drawing Sheets

30μm

20μm

20μm

30μm

OXIDE-BASED SUPERCONDUCTOR, A PROCESS FOR PREPARING THE SAME AND A WIRE MATERIAL OF COMPRISING THE SAME

BACKGROUND OF THE INVENTION

1) Field of the Invention

The present invention relates to an oxide-based superconductor, formed by reaction of a low melting point composition with a solid composition, a process for producing the same and a wire material comprising the same.

2) Related Prior Art

It is known that oxide-based superconductors comprising Tl, Pb, Sr, Ca and Cu have a high critical temperature, and magnetically determined critical current densities of their superconductor grams are high at 77 K in a high magnetic field. Thus, oxide-based superconductors comprising Tl, Pb, Sr, Ca and Cu are promising materials for superconducter wire materials, thin film devices, etc. for use at a liquid nitrogen temperature in a high magnetic field.

Further, it is well known in the process for preparing oxide superconductors to utilize a diffusion reaction between two kinds of substances, which each comprise a combination of oxide superconductor-constituting elements [Spring Annual Conference of Teion Kogaku-Tyodendo Gakkai (Cryogenic-superconductor Society), Lectures, page 98 (1988) and page 121 (1990)].

It has been a problem that the critical transport current densities of bulk materials, wire materials, thin films, etc. prepared from an oxide-based superconductor comprising Tl, Pb, Ba, Sr, Ca and Cu are considerably lower than the above-mentioned magnetically determined critical current densities of crystal grains, add thus it has been difficult to use the oxide-based superconductor in desired products through which a superconducted current is actually to pass. The decrease in the current density of the superconductor members formed therefrom is mainly due to insufficient formation of transport current paths within the members. For example, non-superconductor phases present in the superconductor materials directly inhibit formation of current paths. Furthermore, difference in the orientation of growth of adjacent superconductor crystal grains themselves or disturbances or defects formed at their boundaries give an adverse effect on the electrical characteristics among the crystal grains. In order to realize the distinguished characteristics properly possessed by an oxide super-conductor comprising Tl, Pb, Sr, Ca and Cu such as a high current density in the members formed therefrom, it has been necessary to improve the electric contact among the grains by reducing the non-superconductor phases, increasing the crystal grain sizes (reducing the crystal boundaries), orienting the crystals, and cleaning the crystal boundaries.

SUMMARY OF THE INVENTION

A object of the present invention is to solve these problems and to provide an oxide-based superconductor having distinguished current passing characteristics in a high magnetic field by improving the electric contact among superconductor grains, and a process for producing the same.

DETAILED DESCRIPTION OF THE INVENTION

According to the present oxide-based superconductor and process for producing the same, there is provided an oxide-based superconductor comprising Tl, Pb, Sr, Ca and Cu or Tl, Pb, Ba, Sr, Ca and Cu, obtained by heat treating a body comprising a low melting point composition comprising the above-mentioned elements and having a melting point of not higher than 880° C. and a solid composition comprising the above-mentioned elements and having a melting point of not lower than 950° C. under such a condition as to partly or entirely melt the low melting point composition, thereby increasing crystal grain sizes of the oxide-based superconductor and improving the electric contact among the crystal grains, wherein it is preferable that non-superconductor grains composed of Sr, Ca and Cu and having grain sizes of not more than 5 μm are included in crystals of the oxide-based superconductor and a ratio of volume of a non-superconductor composed of Ba and Pb to total volume of the non-superconductor is not more than 5%.

Various constitutions and composition ratios of the low melting point composition and the solid composition can be selected, and it is preferable to make the selection so as to obtain a composition ratio equal to the stoichiometric ratio of all the elements that constitute the desired oxide-based superconductor. A mixing ratio of the low melting point composition to the solid composition can be selected in excess of the solid composition-constituting elements over the stoichiometric ratio of all the elements that constitute the desired oxide-based superconductor.

As the solid composition, not only $(Sr_{1-x}Ca_x)_2CuO_3$, wherein x=0 to 1, $(Sr_{1-x}Ca_x)CuO_2$, wherein x=0 to 1, superconductors comprising Tl, Sr, Ca and Cu or Tl, Sr, Ba, Ca and Cu, but also various other superconductors can be selected. As the low melting point composition, on the other hand, various compositions capable of forming a liquid melt under firing conditions can be selected. Compositions comprising Tl, Pb, Ba and Cu or Pb, Ca and Cu, or Pb and Cu are preferable.

As conditions for forming a superconductor from a body of the low melting point composition and the solid composition, various temperatures, periods of time or gas atmospheres can be selected according to compositions to be employed, particularly characteristics of the low melting point composition, and desired superconductor properties. Heat treatment temperature is desirably lower than the temperature at which the desired oxide-based superconductor is decomposed to form a liquid melt. Furthermore, it is preferable to conduct the heat treatment within a temperature range of ±50° C. from the melting temperature of the low melting point composition. The body can be heat treated by heating the entire body at a predetermined temperature in an ordinary electric furnace, or by successively moving a locally heating zone that can heat only part of the body at a predetermined temperature along the body. As a heating source for the heat treatment, a heater, a high frequency induction coil, a light-focussing lamp, a laser, etc. can be used. Various reaction time can be selected in view of reaction temperature, and when a higher temperature than the decomposition temperature of the desired superconductor is employed, it is preferable that the reaction time is not more than 5 hours.

Contact of the low melting point ccmposition to the solid composition can be made by mixing these two compositions together in a pulverized state (mixture form) or placing these two compositions in a discrete form from each other or in the structural form of single lamination or a plurality of successive laminations of layers each of these two compositions. Various forms, such as an ingot form, a wire form, a tape form, a disk form, etc. can be selected. These compositions can be formed on a substrate composed of a single material or a plurality of materials or in a hollow member of a single material or a plurality of materials as a supporting member. For example, the substrates can be metals and oxides. The formation can be made directly not only from powders of the respective compositions, but also from slurries each of these two composition dispersed in a solvent or by various film-forming procedures.

In the production of a desired superconductor by heat treatment of a body comprising a low melting point composition and a solid composition, the present invention is characterized principally by allowing a low melting point composition comprising the superconductor-constituting elements, prepared in advance, to react with a solid composition comprising the superconductor-constituting elements, prepared in advance, under a conditions for partly or entirely melting the low melting point composition. In the present invention, solid-liquid reactions are carried out under various conditions by properly selecting the low melting point composition, and thus acceleration of reaction rate due to the presence of a liquid melt, improvement of sinterability, growth of crystal grains, etc. can be attained as advantages under most suitable conditions for producing the desired superconductor.

Essential conditions for the solid composition for use in the present reaction include a high reactivity with a liquid melt, and pore volume and specific surface area large enough to effectively retain the liquid melt in pores and provide satisfactory reaction sites. On the other hand, complete melting in the reaction temperature range and formation and successive presence of a homogeneous liquid melt are essential for the low melting point composition. It is also essential for the composition of the solid composition and the low melting point composition that these two compositions have a high mutual reactivity and no other reaction products than the desired superconductor are formed by reaction of these two compositions. Thus, it is desirable that the element ratio of these two compositions in combination is equal to the element ratio of the desired superconductor. A mixing ratio of the solid composition to the low melting point composition must be so adjusted that no other components than those for the desired superconductor may remain in principle but in order to prevent inhibition of mutual contact of the crystal grains of the formed superconductor to a maximum due to remaining of unreacted liquid phases selectively among the crystal grains, it is necessary that the amount of the solid composition is slightly in excess of the stoichiometric amount. In the present invention that has taken these essential conditions into consideration, formation of a foreign phase composed of Ba and Pb selectively among the superconductor crystal gains, which has been often encountered in other processes than the present process, can be suppressed.

Depending on selection of the low melting point composition and the solid composition, there may be such a case that the solid composition dissolves into the liquid phase of the low melting point composition and a superconductor is precipitated therefrom as a reaction product. In case of this reaction route, growth of superconductor can be promoted by adding seed crystals capable of serving as neuclei for growth of superconductor to the body in advance. Substances capable of existing stably under reaction conditions and having a similar structure to the crystal structure of the desired superconductor are desirable as seed crystals.

$(Sr_{1-x}Ca_x)_2CuO_3$, wherein x=0 to 1, selected as one of the solid compositions has a small specific surface area and a small pore volume, because it is prepared at such a high temperature as 950° C. in air. However, $(Sr_{1-x}Ca_x)_2CuO_3$ is decomposed into $(Sr_{1-x}Ca_x)_1CuO_2$ having a higher reactivity and CaO by action with Tl, whereby the specific surface area and pore volume can be made larger. Thus, the former is effective as the solid composition. In case of a low melting composition comprising Tl, Sr, Ca and Cu or Tl, Sr, Ba, Ca and Cu, a liquid melt such as Tl is formed initially in the temperature-elevating step, and Tl in the initial liquid melt reacts with $(Sr_{1-x}Ca_x)_2CuO_3$, as mentioned above, to produce $(Sr_{1-x}Ca_x)_1CuO_2$ having a higher reactivity, and the reaction proceeds while forming liquid melts successively. $(Sr_{1-x}Ca_x)_1CuO_2$ itself has a higher reactivity with liquid melts and also can be prepared at a relatively low temperature and thus can have a larger specific surface area and a larger pore volume.

In case of an oxide-based superconductor comprising Tl, Ba, Sr, Ca and Cu as another solid composition, for example, $Tl(Ba, Sr)_2Ca_2Cu_3O_x$, some of Tl sites are replaced with Pb, and thus when there is a Pb-containing liquid melt in contact with the super-conductor, a phase of $(Tl, Pb)(Ba, Sr)_2Ca_2Cu_3O_x$ having a higher contactibility can be obtained through mutual diffusion of Tl and Pb between the solid composition and the liquid melt. In case of $TlBa_2Ca_2Cu_3O_x$ or $TlSr_2Ca_2Cu_3O_x$ as a solid composition, a similar effect can be obtained by the presence of a Pb-containing liquid melt. A PbO-CaO-CuO system and a Pbo-CuO system are preferable as Pb-containing low melting compositions, because they can melt at a temperature of not higher than 875° C. in a relatively wide composition range.

When an oxide-based superconductor is produced above the decomposition-melting temperature, promotion of reaction and improvement of sinterability can be made to some extent, but deposition of a large proportion of foreign phases is often observed. In the present invention the heat treatment temperature can be made lower than the decomposition-melting temperature of the oxide-based superconductor by proper selection of a low melting point composition and a solid composition, while taking advantage of high temperature reaction.

PREFERRED EMBODIMENTS OF THE INVENTION

The present invention will be explained in detail below, referring to Examples.

EXAMPLE 1

Figure 3:
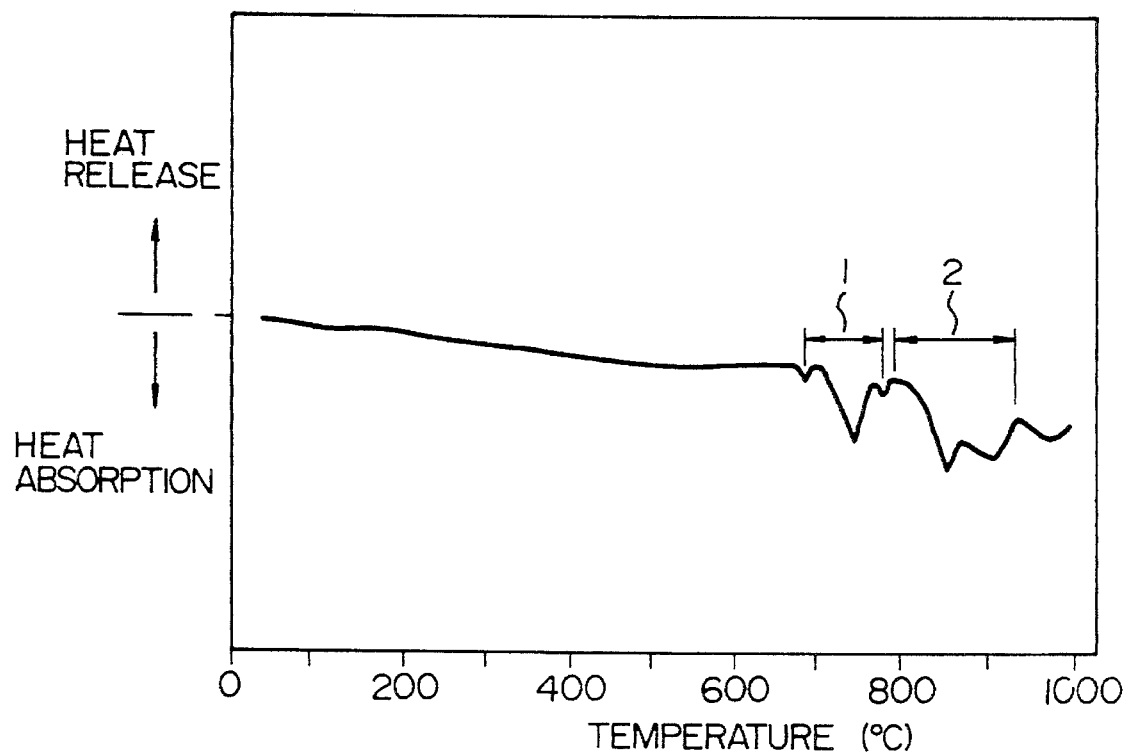
FIG. 3 is a diagram showing characteristics of melting process of a low melting point composition A.

$Tl_2O_3$, PbO, BaO and CuO were weighed out in an atomic ratio of Tl:Pb:Ba:Cu=0.5:0.5:0.4:1, and mixed and ground in an agate mortar for 30 minutes to prepare a low melting point composition A. Thermal characteristics of the thus obtained powdery composition A were measured by a differential thermal balance at a temperature increase rate of 10° C./min in air, and it was found that there were endothermic peaks in a temperature range 1 of 690° C. to 750° C. and a temperature range 2 of 790° C. to 920° C., respectively, due to the melting as shown in FIG. 3. Furthermore, the powdery composition was filled into a magnetic pipe, heated at 875° C. for 30 minutes, and then put into water together with the magnetic pipe to quench the powdery composition A. The powdery composition A was found to be in a completely melt-solidified state. Analysis thereof by an X-ray diffraction analyzer, a scanning electron microscope and an X-ray microanalyzer revealed that most thereof was in a melt-solidified, amorphous phase, in which a very small amount of $BaPbO_3$ and $CuO$ particles were dispersed.

SrO, CaO and CuO were weighed out in a atomic ratio of Sr:Ca:Cu=1:1:1, and mixed and ground in an agate mortar for 30 minutes, then molded into pellets, 20 mm in diameter, by pressing and fired at 950° C. in air for 20 hours. The thus obtained fired pellets were ground in an agate mortar for 30 minutes to prepare a solid composition A. The thus obtained powdery solid composition A was analyzed by an X-ray diffraction analyzer and found to be in the form of $(Sr_{0.5}Ca_{0.5})_2CuO_3$.

Figure 1:
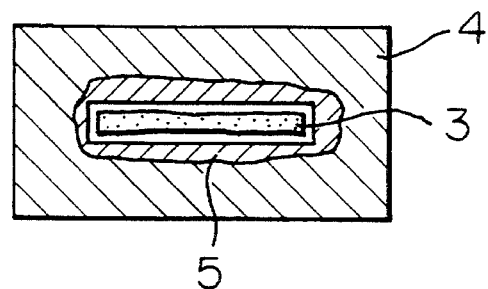
FIG. 1 is a cross-sectional view of a body after heat treatment.
Figure 2:
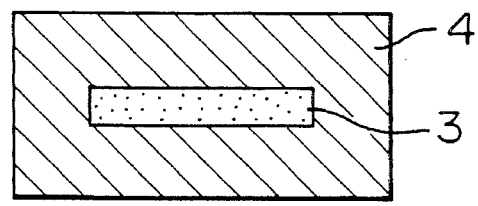
FIG. 2 is a cross-sectional view of a body before heat treatment.
Figure 4:
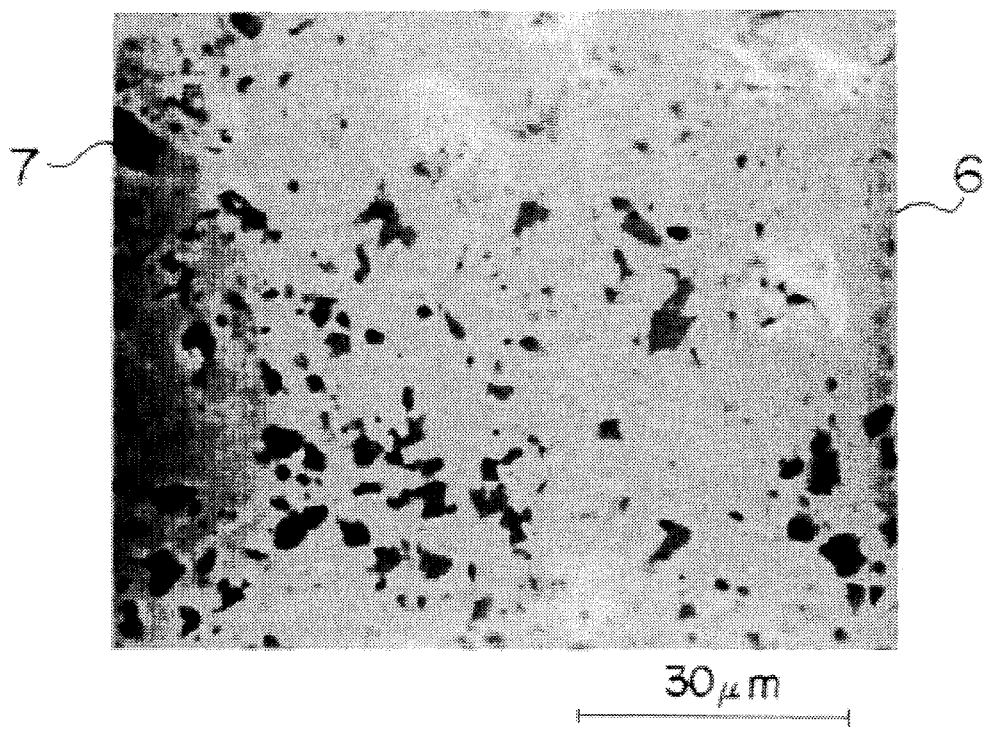
FIG. 4 is a picture showing a crystal structure of the cross-section of a superconductor.

Pellets with the structure shown in FIG. 2, 15 mm in outer diameter and 10 mm thick, were prepared from 1 g of the low melting point A as 3 in FIG. 2 and 10 g of the solid composition A as 4 in FIG. 2. The pellets were fired at 875° C. in air for 4 hours, and it was found that a diffusion reaction phase 5, about 1 μm thick, was formed at the boundary surface between these two compositions 3 and 4, as shown in FIG. 1. Textural structure of the reaction phase is shown in FIG. 4. The reaction phase comprised a superconductor phase 6 represented by the composition formula $(Tl_{0.5}Pb_{0.5})(Sr_{0.8}Ba_{0.2})_2Ca_2Cu_3O_x$ as the main phase and foreign phases 7, about 2 to about 5 μm in grain size, of $(Sr_{0.1}Ca_{0.9})_2CuO_3$, as included in the crystal grains of the main phase. No other foreign phases that can deposit selectively among the crystal grains of superconductor to inhibit the contact of the grain boundaries, such as $BaPbO_3$, were found at all. The thus obtained superconductor layer was cut out and its critical temperature was measured by the ordinary 4-probe procedure and found to be 122 K.

EXAMPLE 2

SrO, CaO and CuO were weighed out in an atomic ratio of Sr:Ca:Cu=0.8:1.2:1 and mixed in the same manner as in Example 1 to prepare a solid composition B of $(Sr_{0.4}Ca_{0.6})_2CuO_3$. The low melting point composition A was heated at 900° C. for 30 minutes, and the resulting heat-treated low melting point composition A was mixed with the solid composition B in an atomic ratio of Tl:Ba:Sr:Ca:Cu=1.0:0.4:1.6:2.0:3.0, and ground in an agate mortar for 30 minutes. Then, the thus obtained powdery mixture was filled in an Ag pipe, 6 mm in outer diameter and 4 mm in inner diameter, and the filled pipe was drawn to an outer diameter of 0.5 mm, and then rolled to a thickness of 0.1 mm. The thus obtained Ag-clad wire material was fired at 870° C. for 10 hours. The superconductor of the thus obtained wire material had substantially the same textural structure as shown in FIG. 4. Critical current densities of the wire material at 77 K in zero magnetic field and at 1 T were measured by a current pass procedure, and found to be 15,000 A/cm$^2$ and 1,000 A/cm$^2$, respectively.

EXAMPLE 3

Figure 5:
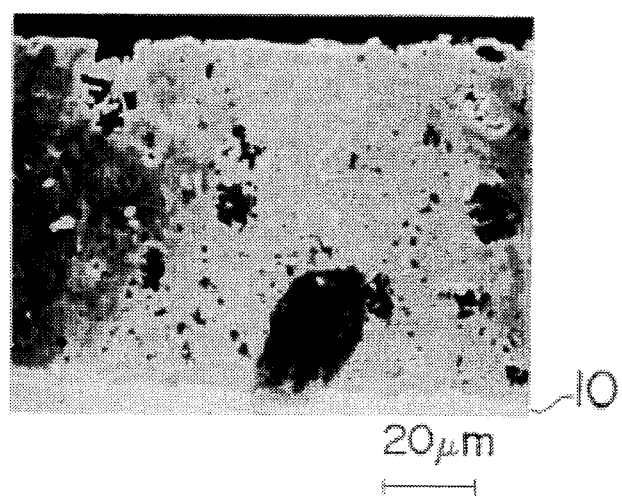
FIG. 5 is a picture showing a crystal structure of the cross-section of another superconductor.

The low melting point composition A and the solid composition A were kneaded with n-butyl acetate, respectively, to prepare the respective pastes. The paste of the solid composition A was applied to an Ag tape, 5 mm wide and 0.2 mm thick, to a thickness of 0.1 mm, dried and then pressed. Then, the paste of the low melting point composition A was applied thereto until an atomic ratio of Tl:Cu=1.0:3.0 was obtained, and then dried and pressed. Then, the thus obtained tape-formed wire material was fired at 875° C. for 4 hours. Cross-section of the tape-formed wire material is shown in FIG. 5, where a superconductor phase composed of $(Tl_{0.5}Pb_{0.5})(Sr_{0.8}Ba_{0.2})_2Ca_2Cu_3O_x$ was formed on the Ag tape 10. Critical current densities of the thus obtained wire material were measured at 77 K in zero magnetic field and at 1 T by a current pass procedure, and found to be on the same levels as in Example 2; respectively.

COMPARATIVE EXAMPLE 1

Figure 6:
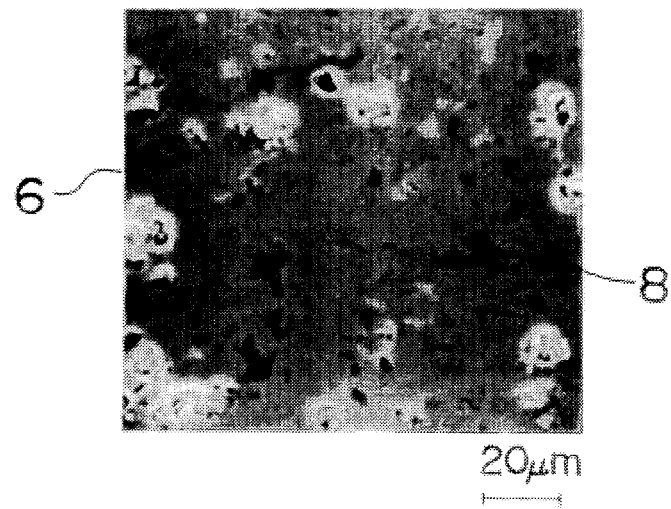
FIG. 6 is a picture showing a crystal structure of the cross-section of other superconductor.

$Tl_2O_3$, PbO, BaO, SrO, CaO and CuO were weighed out in atomic ratio of Ba:Sr:Ca:Cu=0.4:1.6:2:3, and mixed and ground in an agate mortar for 30 minutes and fired at 880° C. in air for 10 hours. Then, $Tl_2O_3$ and PbO were added to the resulting intermediate product to make an atomic ratio of Tl:Pb:Ba:Sr:Ca:Cu=0.5:0.5:0.4:1.6:2:3, and the resulting mixture was mixed and ground for 30 minutes, and then molded into primary pellets. Then, the primary pellets were fired at 880° C. for 10 hours to prepare a superconductor of $(Tl_{0.5}Pb_{0.5})(Sr_{0.8}Ba_{0.2})_2Ca_2Cu_3O_x$. At this stage, the resulting superconductor contained foreign phases of $BaPbO_3$ and Sr-Ca-Cu-O and also had small crystal grains. The superconductor was further fired at 880° C. for 200 hours. Cross-sectional tuxtural structure of the thus obtained pellets is shown in FIG. 6. Crystal grains of the superconductor 6 were grown to grain sizes of 10 to 15 μm due to the prolonged firing, and at the same time $BaPbO_3$ was deposited selectively among grains at the boundaries together with large growth of foreign phases (Sr-Ca-Cu-O) 8. The resulting pellets had a critical current density of 500 A/cm$^2$ at 77 K in zero magnetic field.

COMPARATIVE EXAMPLE 2

Figure 7:
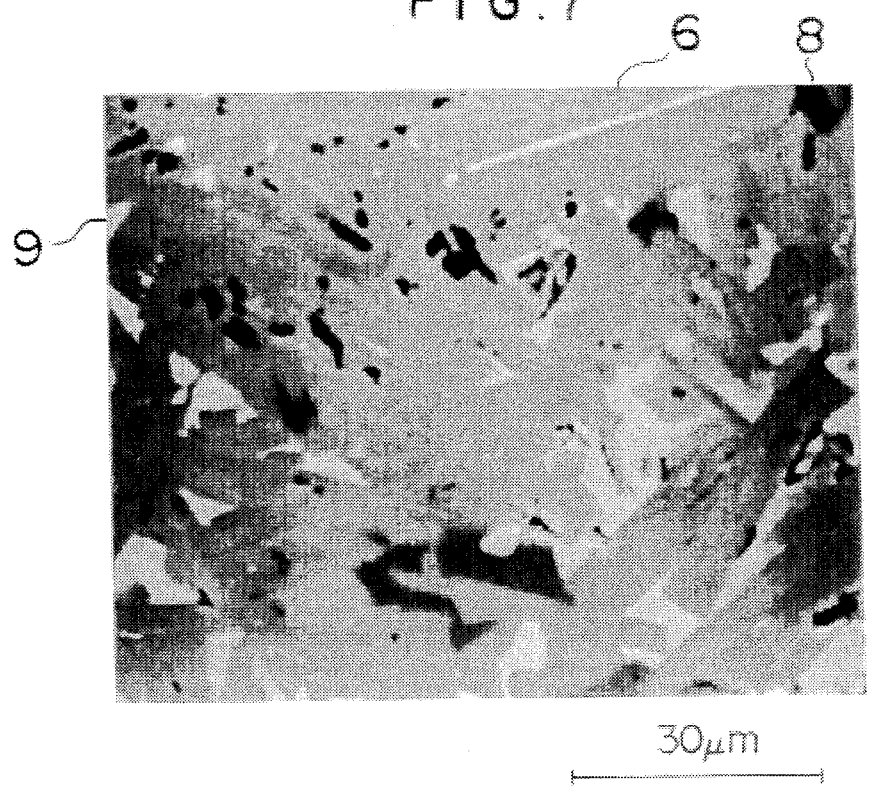
FIG. 7 is a picture showing a crystal structure of the cross-section of a further superconductor.

The primary pellets of Comparative Example 1 were kept at 970° C. for 3 hours and then slowly cooled at a rate of 1° C./min. and successively annealed at 880° C. for 16 hours. Cross-sectional textural structure of the annealed pellets is shown in FIG. 7. Crystal grains of the superconductor were made larger than those of Comparative Example 1 by the heat treatment at the higher temperature, and a proportion of precipitated foreign phases 8 and 9 was also increased. The thus obtained pellets had a critical current density of 500 A/cm$^2$ at 77 K in zero magnetic field.

Firing above the decomposition-melting temperature of the superconductor (880° C.) can make the crystals of the superconductor further grow when there is a liquid melt, but the current paths are considerably hindered by the simultaneous growth of foreign phases and particularly precipitation of $BaPbO_3$ at the grain boundaries.

EXAMPLE 4

BaO and CuO were weighed out in an atomic ratio of Ba:Cu=7:18 and mixed and ground in an agate mortar for 30 minutes and molded into pellets, 20 mm in diameter, by pressing and fired at 900° C. in air for 10 hours. The thus obtained fired pellets were again ground and molded into pellets, and fired at the same temperature for 10 hours. As a result of X-ray diffraction analysis, the resulting fired pellets were in the form of crystal mixture of $BaCuO_2$ and CuO. Then, 0.5 atoms each of Tl and Pb were added as $Tl_2O_3$ and PbO, respectively, to the fired pellets on the basis of one atom of Cu, and mixed and ground in an agate mortar to prepare a low melting point powdery composition B. Thermal characteristics of the powdery composition B were measured by a differential thermal balance at a temperature increase rate of 10° C./min in air, and it was found that there were endothermic peaks in a temperature range of 690° C. to 750° C. and another temperature range of 790° C. to 920° C. due to the melting. Furthermore, the powdery composition B was filled in a magnetic pipe, heated at 875° C. for 30 minutes, and then put into water together with the magnetic pipe to quench the powdery composition B. The powdery composition B was found in a completely melt-solidified state, but no particles of $BaPbO_3$ were found substantially in contrast to the low melting point composition A.

The solid composition A $[(Sr_{0.5}Ca_{0.5})_2CuO_3]$ prepared from SrO, CaO and CuO in an atomic ratio of Sr:Ca:Cu= 1:1:1 and the low melting point B were molded into pellets with the structure as shown in FIG. 2, 15 mm in outer diameter and 10 mm thick, by pressing. The pellets were fired at 875° C. in air for 4 hours, and a compact superconductor layer represented by the composition formula, $(Tl_{0.5}Pb_{0.5})(Sr_{0.8}Ba_{0.2}Ca_2Cu_3O_x)_2$ was formed at the boundary surface between these two compositions to a thickness of about 1 mm, and grains of $(Sr_{0.1}Ca_{0.9})_2CuO_3$ having particle sizes of not more than 1 mm were included in the crystal grains. No foreign phases of $BaPbO_3$ were found at all. The superconductor layer was cut out and its critical temperature was measured by the ordinary four-probe procedure and found to be 123 K.

EXAMPLE 5

The low melting point composition B was heated at 900° C. for 30 minutes, and the resulting fired low melting composition B and the solid composition A were mixed and ground in an agate mortar for 30 minutes to make an atomic ratio of Tl:Ba:Sr:Ca:Cu=1.0:0.4:2:2:3. The thus obtained powdery mixture was filled in an Ag pipe, 6 mm in outer diameter and 4 mm in inner diameter, and the filled pipe was drawn to an outer diameter of 0.5 mm and rolled to a thickness of 0.1 mm. The resulting Ag-clad wire material was fired at 860° C. in air for 6 hours. The thus obtained superconductor of the wire material had substantially the same textural structure as shown in FIG. 4. Critical current densities of the wire material at 77 K in zero magnetic filled and at 1 T, were measured by a current pass procedure and found to be 20,000 $A/cm^2$ and 2,500 $A/cm^2$, respectively.

EXAMPLE 6

10% by weight of crystal grains of $Tl_{0.5}Pb_{0.5}Sr_2Ca_2Cu_3O_x$ superconductor was added to the powdery mixture of Example 5 and an Ag-clad wire material was prepared therefrom in the same manner as in Example 5. The wire material was fired at 860° C. in air for 6 hours. Volume ratio of the superconductor in terms of magnetic susceptibility was improved to 98% from 93% of the material of Example 5.

EXAMPLE 7

The low melting point composition B and the solid composition A were kneaded with n-butyl acetate, respectively, to prepare the respective pastes. The paste of the solid composition A was applied to an Ag tape, 5 mm wide and 0.2 mm thick, to a thickness of 0.1 mm, dried and pressed. Then, the paste of the low melting point composition B was applied thereto until an atomic ratio of Tl:Ba:Sr:Ca:Cu= 1.2:0.4:2:2:4 was obtained, and then dried and pressed. The thus obtained Ag tape wire material was fired at 875° C. in air for 4 hours. Critical current densities of the wire material at 77 K in zero magnetic field and at 1 T were measured by a current pass procedure and found to be 20,000 $A/cm^2$ and 1,500 $A/cm^2$, respectively.

EXAMPLE 8

The non-fired Ag tape wire material of Example 7 was subjected to zone melting growth process, where a heating zone, 5 mm long in the longitudinal direction, with a maximum temperature of 870° C. based on a focussed lamp heating, was travelled at a speed of 10 mm/h in the longitudinal direction of the tape. The thus obtained superconductor layer was composed of crystal grains whose C axis was oriented in the direction perpendicular to the tape surface, and its critical current densities at 77 K and 1 T reached 4,000 $A/cm^2$, respectively.

EXAMPLE 9

PbO and CuO were mixed and ground in an atomic ratio of Pb:Cu=0.78:0.22 in an agate mortar for 30 minutes to prepare a low melting point powdery composition C. Differential thermal analysis thereof showed a sharp endothermic peak at 805° C. Like the low melting point compositions A and B, the powdery composition C was heated at 810° C. for 30 minutes and put into water. The thus obtained composition C was in a completely melt state, and no non-melt particles were found at all even by analysis by an X-ray diffraction analyzer, a scanning slectron microscope and an X-ray microanalyzer.

BaO, SrO, CaO and CuO were weighed out to make an atomic ratio of Ba:Sr:Ca:Cu=0.4:1.6:2:3, and mixed and ground in an agate mortar for 30 minutes and molded into pellets, 20 mm in diameter, by pressing. Then, the pellets were fired at 880° C. in air for 20 hours. Then, $Tl_2O_3$ was added to the fired pellets to make an atomic ratio of Tl:Ba:Sr:Ca:Cu=1.2:0.4:1.6:2.0:3.0, and ground in an agate mortar for 30 minutes. After molding by pressing, the resulting moldings were sealed into a sealed magnetic container and fired at 870° C. for 20 hours. The fired moldings were ground in an agate mortar to obtain a solid powdery composition C. It was found by X-ray diffraction analysis that the thus obtained powdery composition C contained at least 90% of superconductor represented by the composition formula $Tl_1(Sr_{0.8}Ba_{0.2})_2Ca_2Cu_3O_x$.

The low melting point composition C was heated at 810° C. for 30 minutes, and the fired low melting point composition C was mixed with the solid composition C in an atomic ratio of Pb in the low melting point composition C to Tl in the solid composition C of 1:1, and ground in an agate mortar for 30 minutes. Then, the thus obtained powdery mixture was filled in an Ag pipe, 6 mm in outer diameter and 4 mm in inner diameter, and the filled pipe was drawn to an outer diameter of 0.5 mm and then rolled to a thickness of 0.1 mm. Then, the Ag-clad wire material was fired at 850° C. in air for 30 hours. It was found from X-ray diffraction pattern of the superconductor part of the thus obtained wire material that the wire material contained at least 90% of superconductor represented by the composition formula $(Tl_1Pb_{1-x})(Sr_{0.8}Ba_{0.2})_2Ca_2Cu_3O_x$. Critical current densities of the wire material at 77 K in zero magnetic field and at 1 T were measured by a current pass procedure and found to be 38,000 A;cm² and 7,500 A/cm², respectively.

EXAMPLE 10

The low melting point composition C and the solid composition C were kneaded with ethyl alcohol, respectively, to prepare the respective pastes. The paste of the solid composition C was applied to an Ag tape, 5 mm wide and 0.2 mm thick, to a thickness of 1 mm, dried and pressed to a thickness of 0.3 mm. Then, the paste of the low melting point composition C was applied thereto until an atomic ratio of Tl:Pb=1:1 was obtained, then dried and pressed to a thickness of 0.4 mm. The thus obtained Ag tape wire material was fired at 850° C. in air for 30 minutes. Critical current densities at 77 K in zero magnetic field and at 1 T were measured by a current pass procedure and found to be on the same levels as in Example 9, respectively.

EXAMPLE 11

PbO, CaO and CuO were mixed in an atomic ratio of Pb:Ca:Cu=0.74:0.07:0.19 and ground in an agate mortar to prepare a low melting point powdery composition D. Results of differential thermal analysis of the powdery composition D, as shown in FIG. 3, revealed that there was a sharp endothermic peak at 790° C. The powdery composition D was heated at 795° C. for 30 minutes and quenched in water. The quenched composition D was in a complete melt state and no such non-melt grains as in the low melting point composition C were found at all.

The low melting point powdery composition D was heated at 810° C. for 30 minutes, and the heated low melting point powdery composition D was mixed with the solid composition C in an atomic ratio of Pb in the low melting point composition D to Tl in the solid composition C of 1:1, and ground in an agate mortar for 30 minutes. The thus obtained powdery mixture was filled in an Ag pipe, 6 mm in outer diameter and 4 mm in inner diameter, and the filled pipe was drawn to an outer diameter of 0.5 mm and then rolled to a thickness of 0.1 mm. The thus obtained Ag-clad wire material was fired at 850° C. in air for 30 hours. Critical current densities of the wire material at 77 K in zero magnetic field and at 1 T were measured by a current pass procedure and found to be 12,000 A/cm² and 1,000 A/cm², respectively.

EXAMPLE 12

The low melting point composition D and the solid composition C were kneaded with n-butyl acetate, respectively, to prepare the respective pastes. The paste of the solid composition C was applied to an Ag tape, 5 mm wide and 0.2 mm thick, to a thickness of 0.1 mm, dried and pressed. Then, the paste of the low melting point composition D was applied thereto until an atomic ratio of Tl:Pb=1:1 was obtained, and then dried and pressed. The thus obtained Ag tape wire material was fired at 850° C. in air for 30 hours. Critical current densities of the wire material at 77 K in zero magnetic field and at 1 T were measured by a current pass procedure and found to be on the same levels as in Example 11, respectively.

According to the present invention, an oxide-based superconductor, a wire material comprising the same, a magnet comprising the same, etc., which have a high critical current density under cooling by liquid nitrogen in a high magnetic field, can be used in various apparatuses.

What is claimed is:

1. A superconducting material comprising an elongated body having a first portion of a solid low melting point composition, a second portion of a solid composition and an intermediate oxide-based superconductor arranged between the first and second portions, the solid low melting point composition containing Pb, Ca and Cu or Pb and Cu, and the solid composition containing Tl, Sr, Ca and Cu or Tl, Sr, Ba, Ca and Cu, wherein the low melting point composition melts at a temperature below the melting point of the solid composition, and wherein the oxide-based superconductor is a reaction product formed between the first portion and the second portion when the first portion is in contact with the second portion and is heated to a temperature which melts the low melting point composition but not the solid composition.

2. The superconducting material according to claim 1, wherein the first portion and the second portion are mixed as separate phases to form a mixture.

3. The superconducting material according to claim 2, further comprising a hollow sheath of metal, wherein the mixture is filled inside the hollow sheath of metal.

4. The superconducting material according to claim 2, further comprising a tape-shaped substrate of metal or oxide, wherein the mixture contacts the tape-shaped substrate.

5. The superconducting material, according to claim 2, wherein the mixture is molded into a pellet.

\* \* \* \* \*